United States Patent [19]
Rynhart et al.

[11] Patent Number: 5,415,038
[45] Date of Patent: May 16, 1995

[54] HAND-HELD SENSING INSTRUMENT

[75] Inventors: Alan Rynhart, Delgany; Brendan Farrell; Sean Fallon, both of Dublin, all of Ireland

[73] Assignee: Rynhart Research Limited, Delgany, Ireland

[21] Appl. No.: 923,376

[22] Filed: Jul. 31, 1992

[30] Foreign Application Priority Data

Aug. 1, 1991 [IE] Ireland ............... 2657/91

[51] Int. Cl.⁶ ............... G01D 11/04; H05K 5/02; G01R 3/00; G12B 9/04
[52] U.S. Cl. ............... 73/431; 29/729
[58] Field of Search ............... 73/431; 29/729, 738, 29/758, 592.1, 593, 594, 595; 361/395, 398

[56] References Cited

U.S. PATENT DOCUMENTS

| | | | |
|---|---|---|---|
| 4,209,723 | 6/1980 | Hamman | 310/112 |
| 4,287,764 | 9/1981 | Staab et al. | 73/431 |
| 4,370,613 | 1/1983 | Montagu | 324/154 R |
| 4,493,987 | 1/1985 | Kammeraad | 235/1 D |
| 4,597,291 | 7/1986 | Motomiya | 73/431 |
| 4,696,189 | 9/1987 | Hochreuther | 73/431 |
| 4,718,279 | 1/1988 | Hestich | 73/734 |
| 4,791,531 | 12/1988 | Jessup | 361/395 |
| 4,860,901 | 8/1989 | Hochreuther et al. | 73/431 X |
| 4,992,635 | 2/1991 | Westcott | 200/293 |
| 5,008,775 | 4/1991 | Schindler | 361/383 |

FOREIGN PATENT DOCUMENTS

| | | |
|---|---|---|
| 0359161 | 3/1990 | Germany . |
| 1183647 | 3/1970 | United Kingdom . |

*Primary Examiner*—Tom Noland
*Attorney, Agent, or Firm*—Scully, Scott, Murphy & Presser

[57] ABSTRACT

This invention relates to hand-held instruments such as moisture meters (1). An extruded aluminum channel is cut to form a housing blank (2). This blank has inwardly directed ribs (20, 21) which form grooves so that a circuit (22) may be easily slid into the housing, as may a backing plate (27). End caps (5, 14) are secured to the ends of the blank (2) using self-tapping screws (5(a), 5(b)) which engage the ends of ribs (20, 21). The instrument is of extremely rigid construction and does not distort easily and secondly, the method of production is extremely simple and versatile. Versatility is achieved, for example, by the fact that the backing plate may include any different type of sensor and the front of the instrument may be configured according to a label which is secured to the housing blank which may cover apertures which are not needed for switches. Thus, the same housing blank may be used for all instruments and the same manufacturing techniques may also be used.

8 Claims, 6 Drawing Sheets

HAND-HELD SENSING INSTRUMENT

BACKGROUND OF THE INVENTION

1. Technical Field

The invention relates to hand-held instruments and to their production. Examples of such instruments include moisture meters, thermometers, pH meters, and humidity meters.

2. Prior Art Discussion

At present, many such instruments comprise a moulded plastics housing within which is inserted the necessary circuits and input and output devices. The housing often comprises two moulded plastics halves which are either screwed or clipped together.

One problem with such a construction is that production of the instrument is expensive because production steps are relatively awkward and difficult to automate, and because there are a relatively large number of parts. For example, it is awkward to insert a circuit and the relevant components into the housing halves and to secure them into position. Another production problem is that in many cases each different type of instrument within a range of instruments must be produced individually from the beginning of the production process, because different housings will often be required for each circuit. There is thus very little versatility in production.

One attempt at improving production efficiency for instruments generally is described in British Patent Specification No. 1183647 (DE'ATH). This specification describes an instrument case comprising a front, a back and four side plates, which are all screwed together at mitred corners. Because the individual plates may be extruded and cut to the desired length, it appears that production efficiency would be improved in comparison with the first-mentioned prior art. However, this instrument has quite a large number of parts and thus production efficiency and cost would appear to be still quite high.

A further problem with presently available hand-held instruments is that the housing or casing may be relatively easily distorted. This can cause considerable problems for instruments such as moisture meters where it is essential that the support for sensors such as capacitive pads remain rigid.

OBJECTS OF THE INVENTION

The invention is directed towards providing a method of producing a hand-held instrument which is more efficient and less costly than heretofore. Another object is that the production method be versatile for production of different instruments. A still further object of the invention is to provide a hand-held instrument which is of high strength and thus not susceptible to distortion.

SUMMARY OF THE INVENTION

According to the invention, there is provided a method of producing a hand-held instrument, the method comprising the steps of:

producing a housing blank which is channel-shaped in cross-section, having a base for forming an instrument front wall, and a pair of side walls;

making apertures in the front wall;

mounting an instrument circuit into the blank behind the front wall;

mounting a backing plate into the blank behind the instrument circuit; and securing end caps to the ends of the housing blank.

According to another aspect, the invention provides a hand-held instrument comprising:

housing blank which is channel-shaped in cross-section, having a base which forms an instrument front wall, and a pair of side walls, the front wall having apertures;

an instrument circuit mounted behind the front wall;

a backing plate mounted behind the instrument circuit; and end caps secured to the ends of the housing blank.

According to a still further aspect, the invention provides a housing blank for production of a hand-held instrument, the blank being channel-shaped in cross-section and having a base for forming an instrument front wall, and a pair of side walls, the front walls having apertures.

BRIEF DESCRIPTION OF THE DRAWINGS

The invention will be more clearly understood from the following description of some preferred embodiments thereof, given by way of example only with reference to the accompanying drawings in which.

DESCRIPTION OF THE PREFERRED EMBODIMENTS

Figure 1:
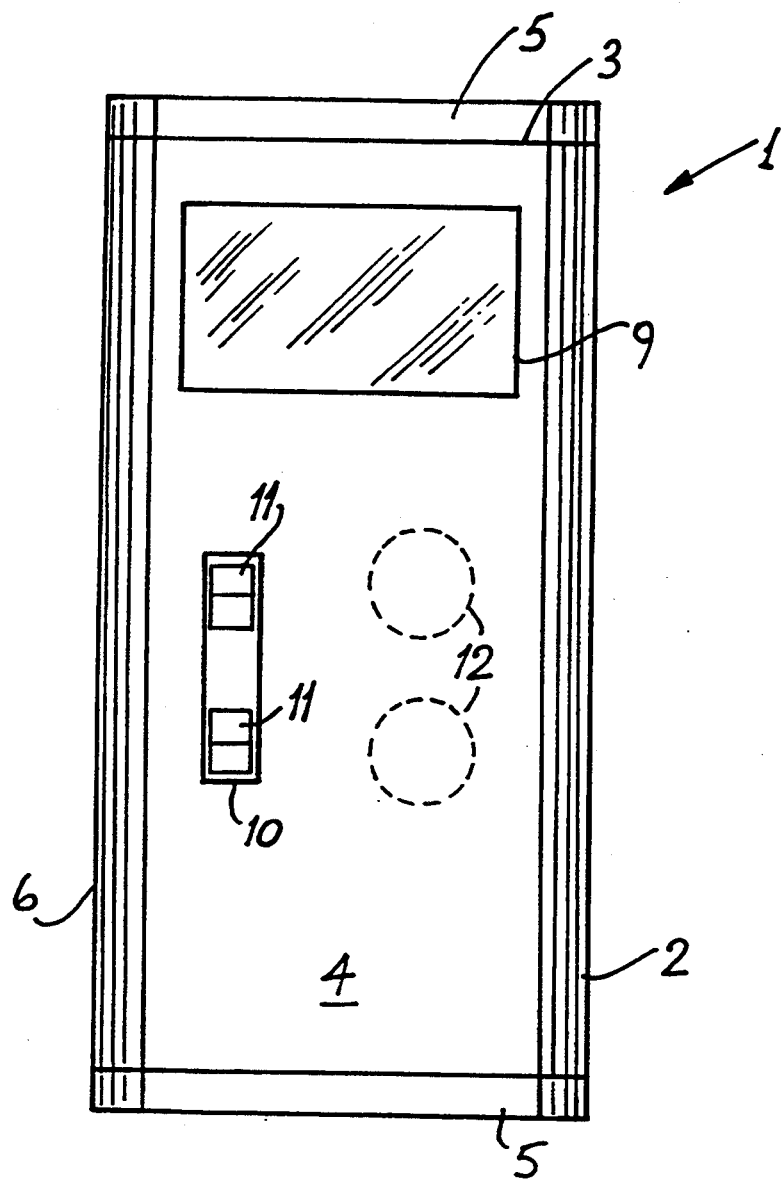
FIG. 1 is a front view of a hand-held instrument of the invention, in this case a moisture meter.
Figure 2:
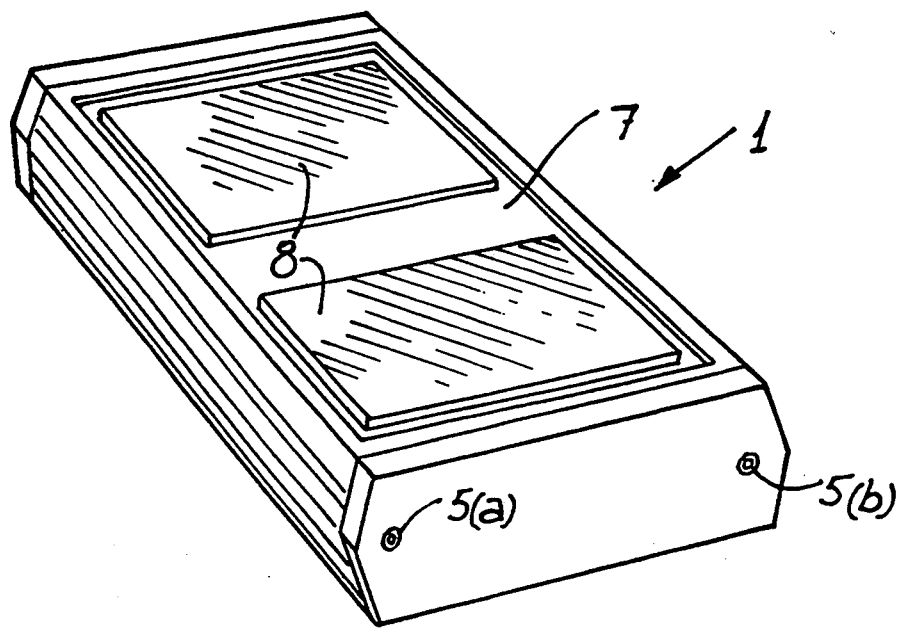
FIG. 2 is a perspective view showing the rear side of the meter.

Referring to FIGS. 1 and 2, there is illustrated a hand-held instrument, in this case a moisture meter 1. The meter 1 comprises a housing blank 2 of channel-shaped construction. The housing blank has a base which forms a front wall 3 to which a label 4 is adhered. End caps 5 are secured to each end of the blank 2 by self-tapping screws 5(a) and 5(b). The back of the meter 1 comprises a backing plate 7 to which are secured a pair of electrode pads 8 for capacitive moisture detection. The label 4 which is adhered to the front wall 3 is of flexible plastics material and includes a transparent portion 9 which is aligned with an aperture, not shown in FIGS. 1 and 2, having a similar shape in the front wall 3 to form a window for the instrument. The label 4 has a cut-out aperture 10 to allow access to switches 11 connected to a circuit within the meter 1. Apertures 12 in the front wall 3 are shown by interrupted lines and these are covered by the label 4. Switches within the meter 1 may be operated using the label 4 because of its flexibility.

Figure 3:
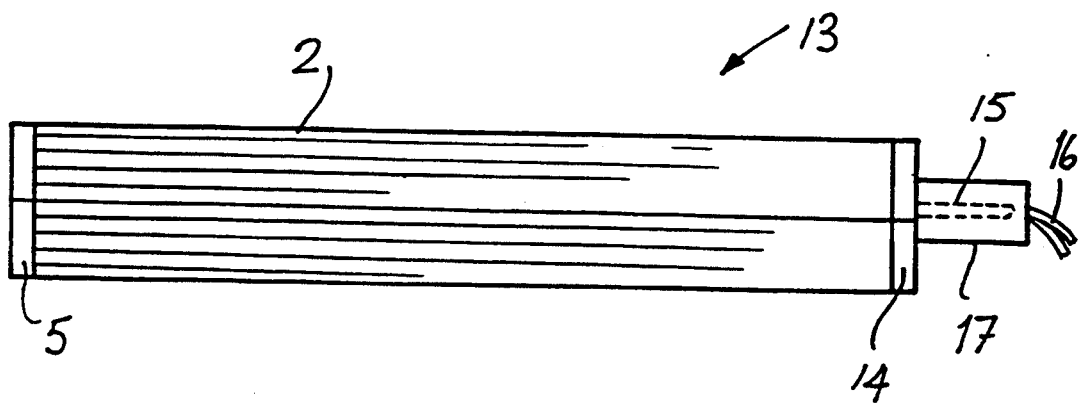
FIG. 3 is a side view of an alternative construction of moisture meter.

Referring to FIG. 3, there is shown an alternative construction of moisture meter indicated by the reference numeral 13 in which parts similar to those described with reference to FIGS. 1 and 2 are identified by the same reference numerals. In this embodiment, there is an end cap 14 which carries sensor pins 15 and a strap 16 for the meter. The strap 16 passes through holes in a cover 17 for the pins 15 so that it may be slid on and off the pins 15, when desired, without falling from the meter 13. In this embodiment, the meter does not have electrode pads 8, however, it is possible that the backing plate 7 would have electrode pads 8 to improve versatility of use of the instrument.

Referring now to FIGS. 4 to 8 inclusive, instruments of the invention are shown in more detail and their production methods are also shown. Again, parts similar to those described with reference to the previous drawings are identified by the same reference numerals. The front wall 3 has a shallow longitudinal channel 18 for reception of the sliding switches 11. A display aperture 19 for alignment with the window 9 in the label 4 is shown, as are the apertures 12. The side walls 6 have inwardly-directed longitudinal strengthening ribs 20 which form a pair of opposed inner grooves. The ribs 20 have curved inner surfaces to form a bearing surface for reception of the self-tapping screws 5(a) and 5(b).

The side walls 6 also include longitudinal strengthening ribs 21 which form a pair of opposed outer grooves.

Figure 4:
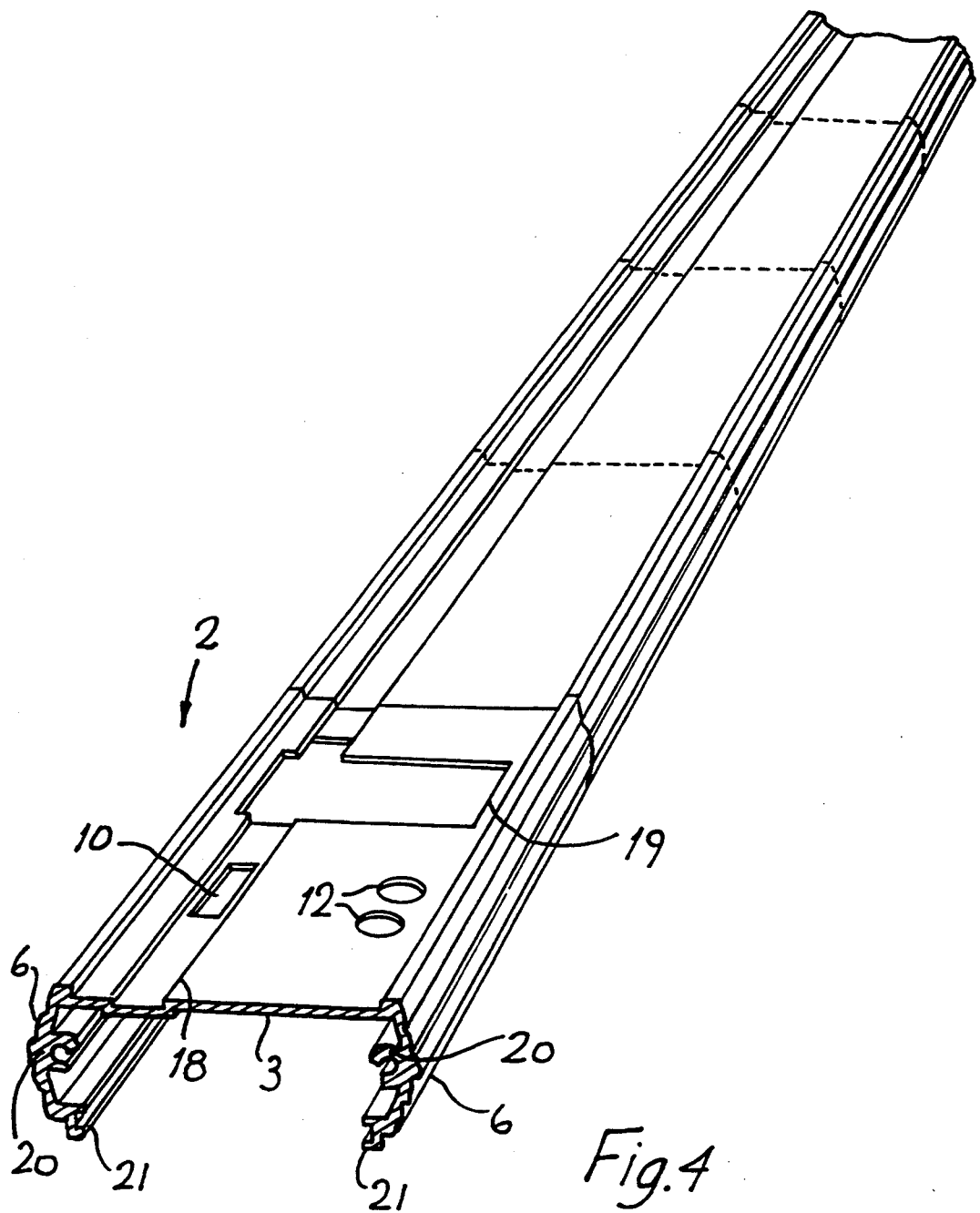
FIG. 4 is a perspective view of housing blanks during a production process of the invention.

Production of the moisture meters involves initially extruding aluminium lengths having the cross-section shown in FIG. 4. A length is then cut to individual blanks which are of the correct size for production of a particular moisture meter. In this embodiment all moisture meters within a range of different meters have the same length.

Subsequently, the apertures 10, 12 and 19 are stamped in the front wall 3. It has been found that because the housing blank 2 is of channel-shaped construction, tooling for stamping of the front wall 3 is relatively simple as it may easily access the rear of the front wall 3 for support during the stamping operation. Thus, stamping is considerably less expensive than would be the case, for example, if the housing blank were of tubular cross-section. For each of the different types of meters the same stamping tool is used because redundant apertures are simply covered over by the label.

Figure 5:
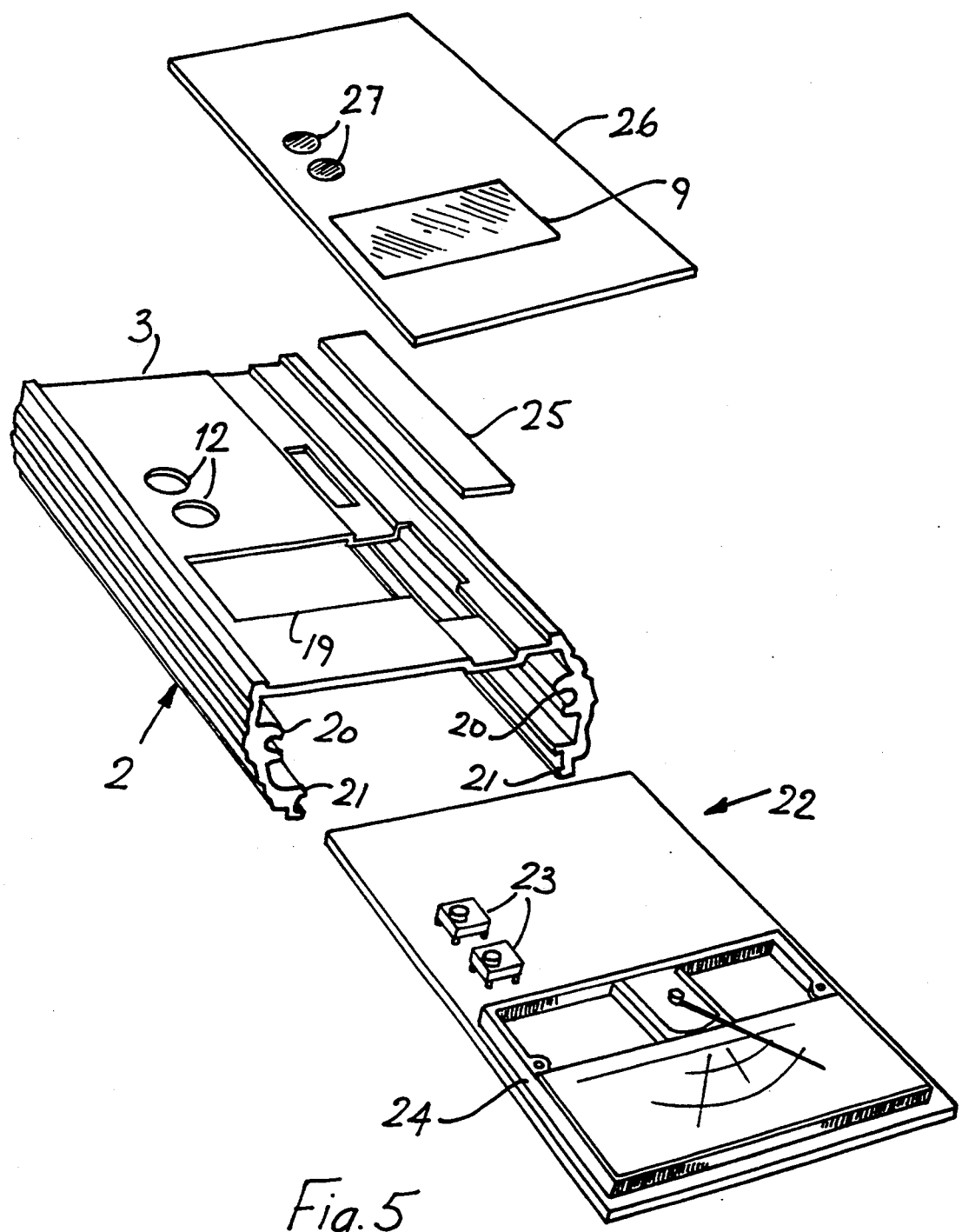
FIGS. 5 and 6 are exploded views showing assembly of a meter.
Figures 6A, 6B:
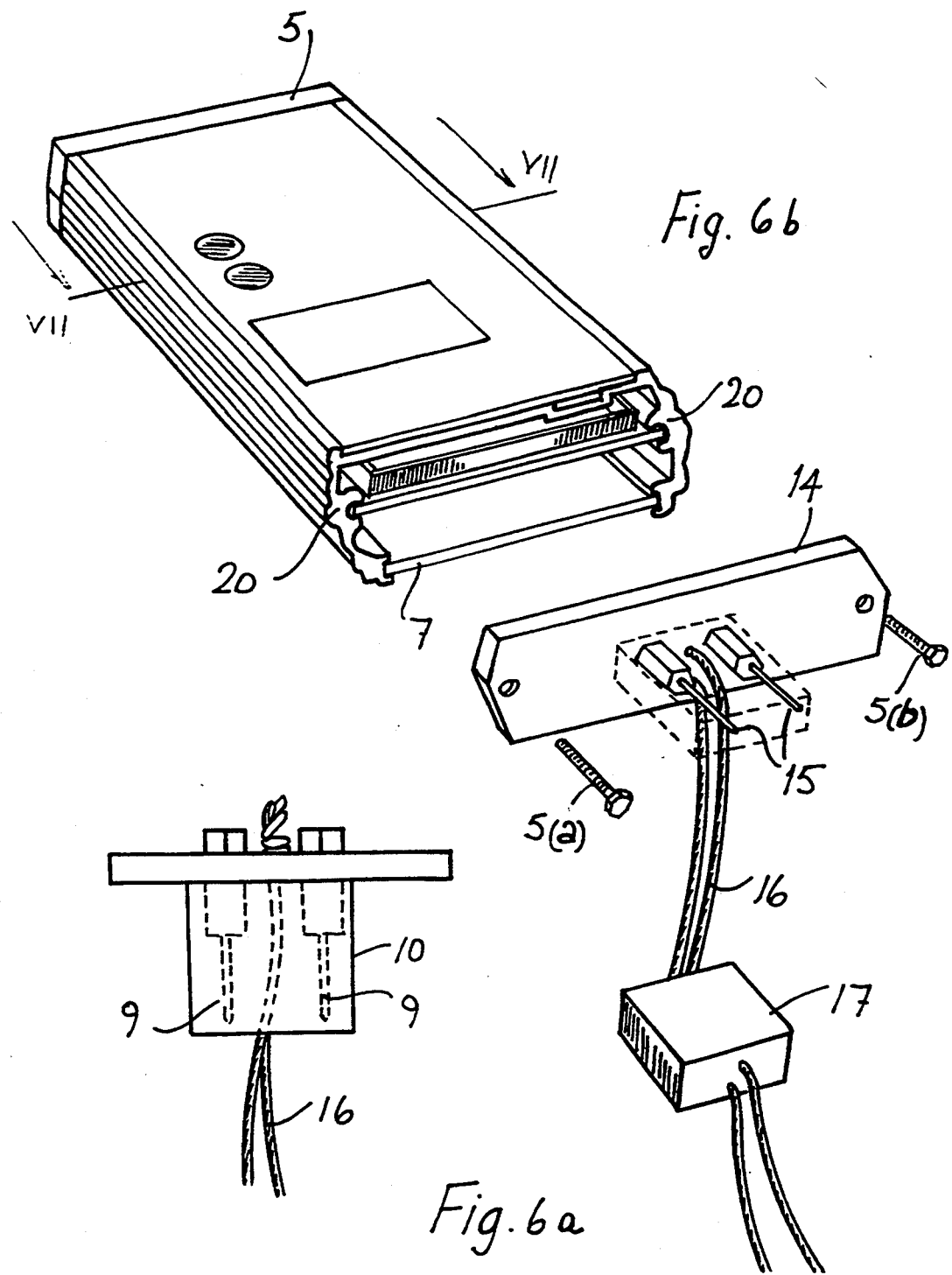
Figure 7:
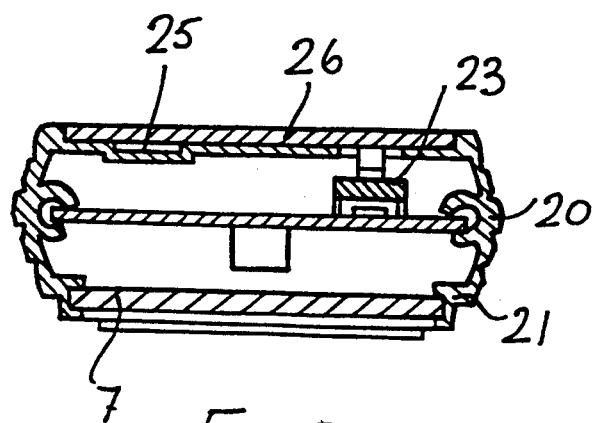
FIGS. 7 and 8 are cross-sectional views in the direction of the arrows VII—VII of FIG. 6.
Figure 8:
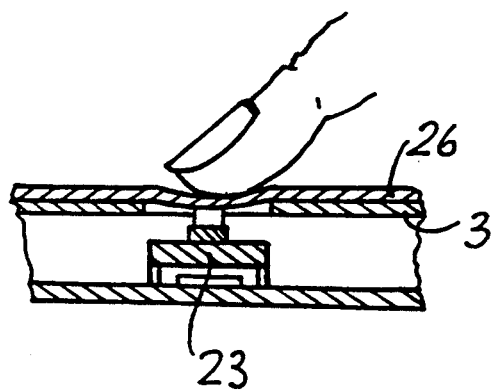

Referring now to FIG. 5, a moisture meter circuit 22 is inserted into the housing blank 2 by sliding it into the pair of opposed inner grooves 20 until it is in correct alignment with the apertures in the front wall 3. In more detail, there are tactile switches 23 and a pointer and scale indictor 24. The switches 23 are aligned with the apertures 12 and the indicator 24 is aligned with the aperture 19. The moisture meter which is being produced in this embodiment is not exactly similar to that shown in FIG. 1. In this embodiment, there are no switches 11 on the circuit 22 and thus, the channel 18 in the housing blank 2 is filled in using a plastics strip 25. As shown in FIG. 6, the backing plate 7 is then inserted by simply sliding it in the grooves 21. At this stage, both the circuit 22 and the backing plate 7 are held in position and are flush with the ends of the housing blank 2. The end cap 14 is then placed in position at the top end of the housing blank and is secured in position using the self-tapping screws 5(a) and 5(b) which engage the grooves 20. At the bottom of the housing blank 2, the end cap 5 is secured in position in a similar manner.

Finally, a polyester adhesive label 26 (which is different from the label 4) is adhered to the front wall 3 so that the window 9 is in alignment with the aperture 19. The label 26 has indicia 27 which are aligned with the apertures 12 so that the rear of the label 26 adheres to the tactile switches 23 so that they may be operated through the apertures 12 in use. This is shown clearly in FIGS. 7 and 8. It will be noted from these drawings that the circuit 22 may not be removed by removal of an end cap 5 or 14 and sliding out in the inner grooves 20, because the switches 23 would abut against the side of the apertures 12. This helps to improve the tamper-proof nature of the instrument.

It will be appreciated that the production method of the invention is extremely simple as it involves relatively few parts. Further, individual production operations are very simple, for example, the circuit and the backing plate are simply slid into position and the end cap may be easily secured in position also. The production method is also versatile because the same housing blanks may be used for different circuits, sensors being used by simple selection of an end cap or backing plate and different user interfaces being created by simple selection of a front label which corresponds to the circuit being used. In fact it has been found that production costs of the method of the invention, in comparison with the traditional method of using moulded plastic halves as the instrument casing have almost halved.

It will also be appreciated that the hand-held instrument of the invention has considerable strength because of the ribs 20 and 21 in the side walls 6. Even if the housing blanks were not of metal construction (plastics, for example) there would still be considerable resistance to distortion because of these features.

Not only is the production method of the invention simple and thus inexpensive, but the parts used are also inexpensive. For example, the housing blank which is produced by aluminium extrusion may be produced considerably less expensively than a moulded plastics housing, which would require expensive moulds.

The invention is not limited to the embodiments hereinbefore described, but may be varied in construction and detail.

We claim:
1. A hand-held sensing instrument comprising:
   a) a housing blank which is channel-shaped in cross-section and which includes:
      (i) a base having apertures and which forms an instrument front wall, and
      (ii) a pair of side walls;
   b) an instrument circuit mounted behind the instrument front wall;
   c) user interface devices being mounted on the instrument circuit, said devices being in registry with the apertures in the base forming the front wall;
   d) a backing plate mounted behind the instrument circuit;
   e) end caps secured to opposite ends of the housing blank; and
   f) a sensor device.
2. A hand-held sensing instrument as claimed in claim 1, wherein a flexible label is adhered to the instrument front wall, the flexibility of the label facilitating user operation of the interface devices in registry with the apertures.
3. A hand-held sensing instrument as claimed in claim 1, wherein the end caps are held in position by removable thread cutting screws directly engaging grooves in the housing blank side walls.
4. A hand-held sensing instrument as claimed in claim 1, wherein the backing plate supports the sensor device for the instrument.
5. A hand-held sensing instrument as claimed in claim 4, wherein the backing plate is removably supported in opposed grooves formed by the housing blank side walls.

6. A hand-held sensing instrument as claimed in claim 1, wherein an end cap supports the sensor device for the instrument.

7. A hand-held sensing instrument as claimed in claim 6, wherein the sensor device is a pin, and the end cap further supports a strap for the instrument, the strap retaining a removable cover for the pin.

8. A hand-held instrument as claimed in claim 1, wherein the housing blank consists of extruded aluminum.

* * * * *